United States Patent
Chen et al.

(10) Patent No.: US 12,542,381 B2
(45) Date of Patent: Feb. 3, 2026

(54) ELECTRICITY TRANSCEIVER DEVICE AND ITS ELECTRICAL CONNECTOR

(71) Applicant: CHROMA ATE INC., Taoyuan (TW)

(72) Inventors: Wen-Chiu Chen, Taoyuan (TW); Chi-Wen Hung, Taoyuan (TW); Chun-Chen Lin, Taoyuan (TW); Li-Shiun Tsai, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 357 days.

(21) Appl. No.: 18/376,150

(22) Filed: Oct. 3, 2023

(65) Prior Publication Data

US 2024/0162635 A1    May 16, 2024

(30) Foreign Application Priority Data

Nov. 15, 2022   (TW) .................................. 111143636

(51) Int. Cl.
*H01R 9/22* (2006.01)
*H05K 7/02* (2006.01)
*H01R 9/18* (2006.01)

(52) U.S. Cl.
CPC .............. *H01R 9/223* (2013.01); *H05K 7/02* (2013.01); *H01R 9/18* (2013.01)

(58) Field of Classification Search
CPC ............. H01R 9/223; H01R 9/18; H05K 7/02
USPC .................................................... 439/620.01
See application file for complete search history.

(56) References Cited

U.S. PATENT DOCUMENTS

| | | | |
|---|---|---|---|
| 2014/0268611 A1* | 9/2014 | Naufel | H05K 7/1457 361/767 |
| 2015/0056861 A1* | 2/2015 | Sasaki | H01R 13/665 439/620.01 |
| 2022/0021148 A1 | 1/2022 | Kudo | |

FOREIGN PATENT DOCUMENTS

| | | |
|---|---|---|
| CN | 202127129 U | 1/2012 |
| CN | 104051879 B | 4/2017 |
| TW | M537337 U | 2/2017 |
| TW | M538266 U | 3/2017 |
| TW | M639338 U | 4/2023 |

* cited by examiner

*Primary Examiner* — Tulsidas C Patel
*Assistant Examiner* — Thaslimur Rahman
(74) *Attorney, Agent, or Firm* — CKC & Partners Co., LLC

(57) ABSTRACT

A power transceiver device includes a housing, a circuit module and an electrical connector. The circuit module is located within the housing. The electrical connector includes a terminal base and two conductive terminals. The terminal base is fixed on one side surface of the housing. Each of the conductive terminals includes a sheet, an extending portion and an opening. One end of the sheet extends through a front face of the terminal base, another end thereof is electrically connected to the circuit module. The extending portion extends transversely from the end of the sheet, the opening is firmed on the extending portion, and a virtual axis of the opening passes through the front lateral face of the terminal base. The conductive terminals are switchably electrically connected to each other.

19 Claims, 6 Drawing Sheets

ELECTRICITY TRANSCEIVER DEVICE AND ITS ELECTRICAL CONNECTOR

RELATED APPLICATIONS

This application claims priority to Taiwan Application Serial Number 111143636, filed on Nov. 15, 2022, which is herein incorporated by reference in its entirety.

BACKGROUND

Field of Disclosure

The present disclosure relates to an electricity transceiver device and its electrical connector. More particularly, the present disclosure relates to an electrical connector with L-shaped terminals and an electricity transceiver device having the electrical connector.

Description of Related Art

Generally, a conventional power supply is provided with an output terminal protruding from a housing thereof. The conventional power supply can provide stable and suitable DC power to a device under test (DUT) through the output terminal for electrical testing of the DUT.

However, most of the output terminals are required to be cross-connected to the components in the housing through jumpers, which makes it inconvenient that the external wires are messy and exposed. In addition, when multiple housings are stacked and assembled together, since the output terminals of each of the power supplies are mostly set to be locked vertically, the operator's assembly time and the convenience of the output terminal will be affected because the locking method of the output terminal may interfere the wiring construction direction.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide an electricity transceiver device and its electrical connector for solving the difficulties mentioned above in the prior art.

In one embodiment of the present disclosure, a power transceiver device includes a housing, a first circuit module and an electrical connector. The housing surrounds an accommodating space. The first circuit module is received within the accommodating space. The electrical connector includes a terminal base, at least one first conductive terminal and at least one second conductive terminal. The first conductive terminal penetrates through the terminal base, and the first conductive terminal includes a first sheet, a first extending portion and a first opening. One end of the first sheet extends through a front lateral face of the terminal base, and another end of the first sheet is electrically connected to the first circuit module. The first extending portion extends transversely from the end of the first sheet, and formed with an included angle with the first sheet. The first opening is located on the first extending portion, and a virtual axis of the first opening passes through the front lateral face of the terminal base. The second conductive terminal penetrates through the terminal base, and the second conductive terminal includes a second sheet, a second extending portion and a second opening. One end of the second sheet extends through the front lateral face of the terminal base, and arranged abreast with the first sheet. The second extending portion extends transversely from the end of the second sheet, and formed with an included angle with the second sheet. The second opening is located on the second extending portion, and a virtual axis of the second opening passing through the front lateral face of the terminal base. The second conductive terminal is switchably electrically connected to the first conductive terminal.

In one embodiment of the present disclosure, an electrical connector of an electricity transceiver device includes a terminal base, at least one first conductive terminal and at least one second conductive terminal. The first conductive terminal penetrates through the terminal base, and the first conductive terminal includes a first sheet, a first extending portion and a first opening. One end of the first sheet extends through a front lateral face of the terminal base of the terminal base. The first extending portion extends transversely from the end of the first sheet, and formed with an included angle with the first sheet. The first opening is located on the first extending portion, and a virtual axis of the first opening passes through the front lateral face of the terminal base. The second conductive terminal penetrates through the terminal base, and the second conductive terminal includes a second sheet, a second extending portion and a second opening. One end of the second sheet extends through the front lateral face of the terminal base, and arranged abreast with the first sheet. The second extending portion extends transversely from the end of the second sheet, and formed with an included angle with the second sheet. The second opening is located on the second extending portion, and a virtual axis of the second opening passing through the front lateral face of the terminal base. The second conductive terminal is switchably electrically connected to the first conductive terminal.

Thus, through the construction of the embodiments above, the disclosure is not required to be cross-connected to components in the housing through jumpers, thus, the operator is allowed to be guided to complete the coupling task in a locking direction perpendicular to a side plate of the housing, so as not to interfere with the locking direction, thereby optimizing the assembly time and convenience.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
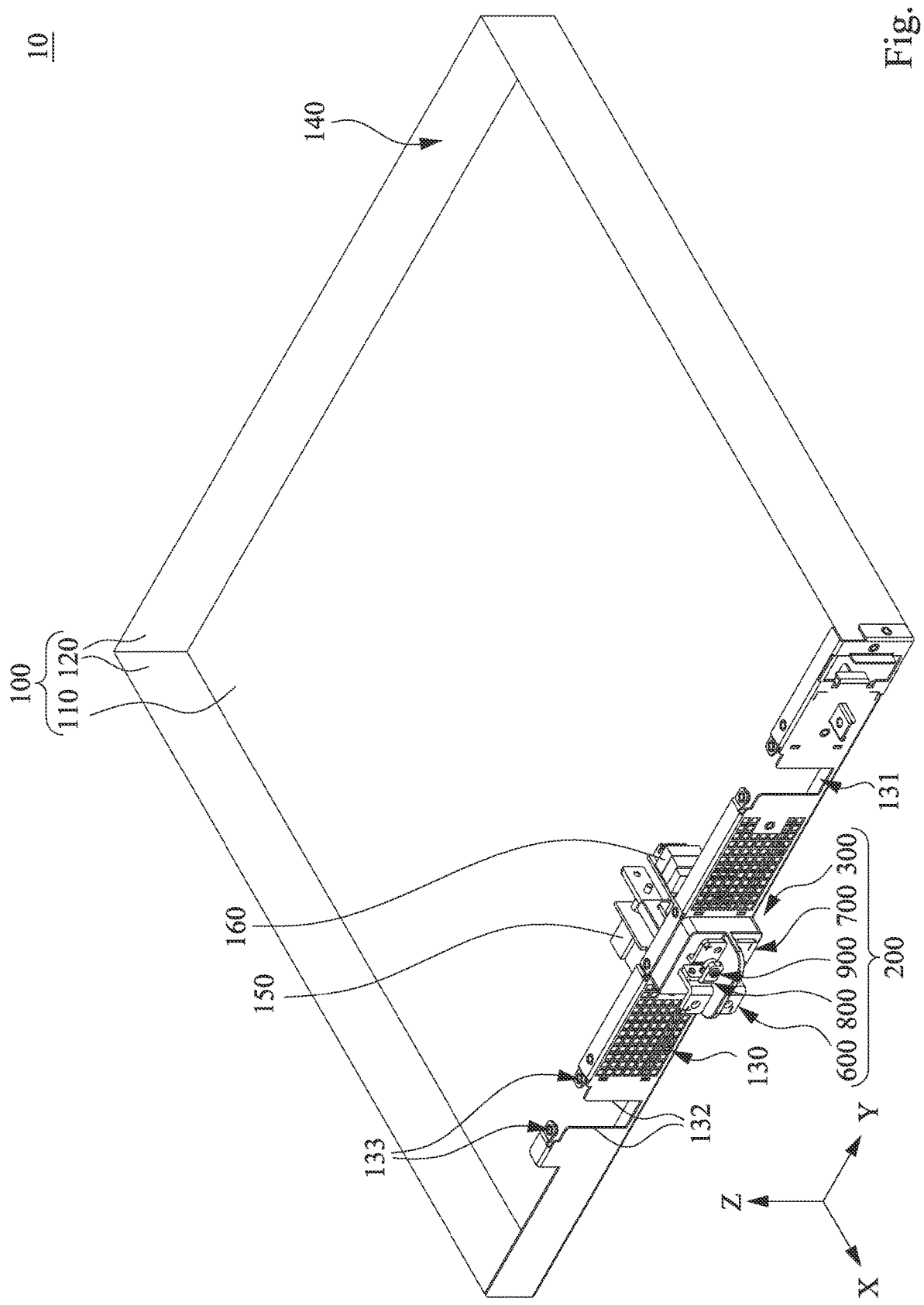
FIG. 1 is a schematic view of an electricity transceiver device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1, in which FIG. 1 is a schematic view of an electricity transceiver device 10 according to one embodiment of the present disclosure. As shown in FIG. 1, in this embodiment, the electricity transceiver device 10 includes a housing 100, a first circuit module 150, a second circuit module 160 and at least one electrical connector 200. The housing 100 includes a bottom plate 110 and a plurality of side plates 120. An accommodating space 140 is surrounded by the bottom plate 110 and the side plates 120 together. The electrical connector 200 is fixed on one of the side plates 120 of the housing 100. One part of the electrical connector 200 is located within the accommodating space 140, and another part of the electrical connector 200 penetrates outwards from the housing 100 through the aforementioned side plate 120. The first circuit module 150 and the second circuit module 160 are respectively located within the accommodating space 140. In the embodiment, the electrical connector 200 is electrically connected to the first circuit module 150 and the second circuit module 160. However, the present disclosure is not limited thereto, in another embodiment, the electrical connector 200 is only electrically connected to one of the first circuit module 150 and the second circuit module 160. It is noted, the housing 100 further includes a top cover (not shown in figures). The top cover is used to cover the accommodating space 140 for protecting internal components in the housing 100. However, in order to clearly illustrate the electrical connector 200, FIG. 1 is drawn to see through the top plate for showing the features of the electrical connector 200 inside the housing 100.

Figure 2:
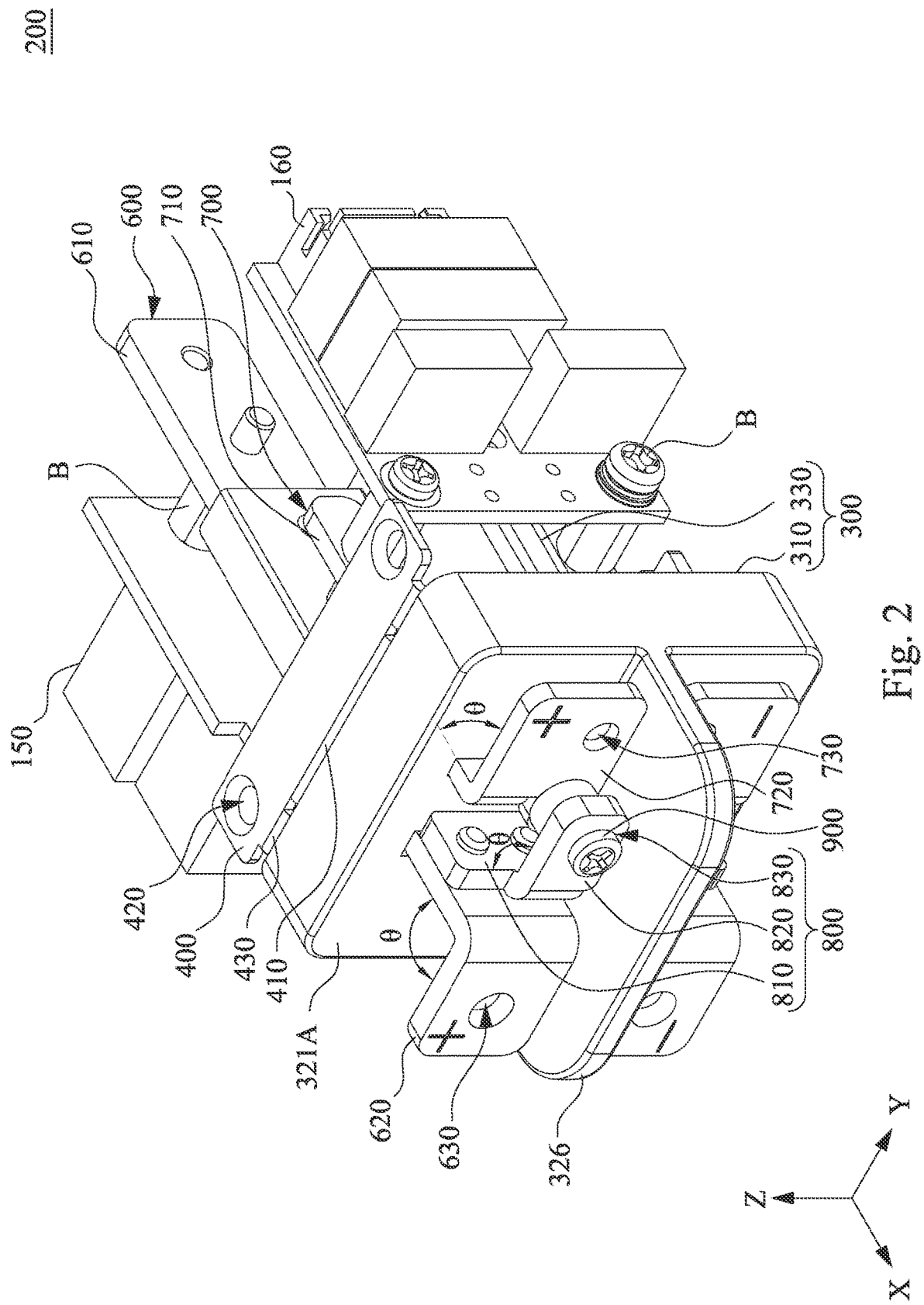
FIG. 2 is a perspective view of the electrical connector of FIG. 1.
Figure 3:
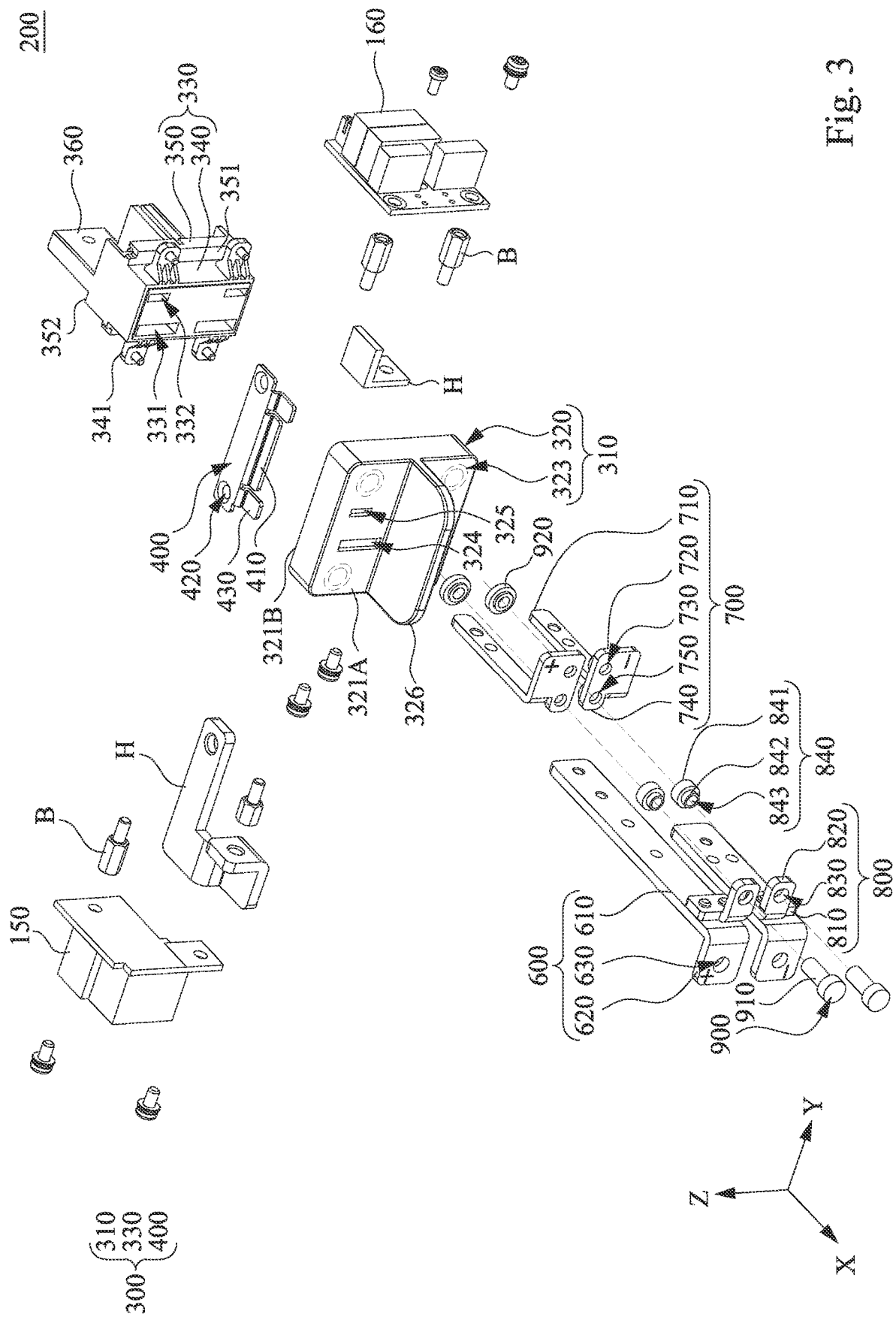
FIG. 3 is a disassembled view of the electrical connector of FIG. 2.
Figure 4:
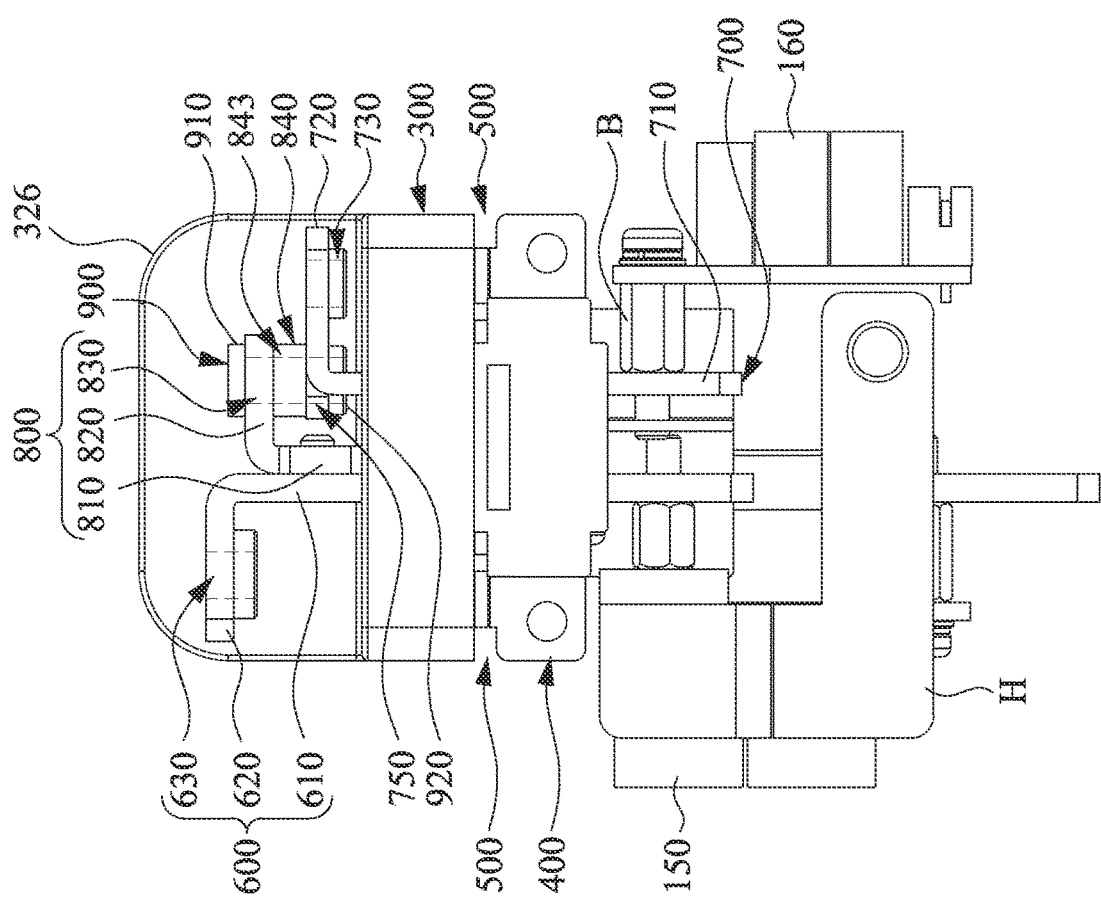
FIG. 4 is a bottom view of the electrical connector of FIG. 2.

FIG. 2 is a perspective view of the electrical connector 200 of FIG. 1. FIG. 3 is a disassembled view of the electrical connector 200 of FIG. 2. FIG. 4 is a bottom view of the electrical connector 200 of FIG. 2. As shown in FIG. 2 to FIG. 4, the electrical connector 200 includes a terminal base 300, one or more (e.g., two) first conductive terminals (e.g., electrical-transmission terminals) 600, and one or more (e.g., two) second conductive terminals (e.g., telemetry terminals) 700. The terminal base 300 is fixed on the aforementioned side plate 120 (FIG. 1), and one surface of the terminal base 300 opposite to the accommodating space 140 is referred to a front lateral face (i.e., front surface 321A, FIG. 2) hereinafter. These first conductive terminals 600 and these second conductive terminals 700 are penetrated through the terminal base 300 side by side. In the embodiment, these first conductive terminals 600 are positive and negative electrodes, respectively, and the lengths of these first conductive terminals 600 are different from each other. These second conductive terminals 700 are positive and negative electrodes, respectively, and the lengths of these second conductive terminals 700 are the same, however, the present disclosure is not limited thereto.

Furthermore, each of the first conductive terminals 600 which is in an L-shape includes a first sheet 610, a first extending portion 620 and a first opening (e.g., screw hole) 630. One end of the first sheet 610 extends outwards through a front lateral face of the terminal base 300, another end of the first sheet 610 extends into the accommodating space 140, and electrically connected to the first circuit module 150. In the embodiment, each of the first conductive terminals 600 is connected to the first circuit module 150 through a bracket H or a distance bolt B. However, the present disclosure is not limited thereto. The first extending portion 620 is located out of the housing 100, and extends transversely from the end of the first sheet 610. A long axis direction (e.g., X axis) of the first sheet 610 and a long axis direction (e.g., Y axis) of the first extending portion 620 are orthogonal to, or at least intersected with each other, so that an included angle θ (e.g., 90° or approximated to 90°) is formed between the first sheet 610 and the first extending portion 620. The first opening 630 is located on the first extending portion 620, and faced towards the front lateral face of the terminal base 300, that is, a virtual axis (e.g., X axis) of the first opening 630 passes through the front lateral face of the terminal base 300. Each of the second conductive terminals 700 which is in an L-shape includes a second sheet 710, a second extending portion 720 and a second opening (e.g., screw hole) 730. The second sheet 710 and the first sheet 610 are arranged abreast or parallel to each other. One end of the second sheet 710 extends outwards through the front lateral face of the terminal base 300, and another end of the second sheet 710 extends into the accommodating space 140. The second extending portion 720 is located out of the housing 100, and extends transversely from the end of the second sheet 710. A long axis direction (e.g., X axis) of the second sheet 710 and a long axis direction (e.g., Y axis) of the second extending portion 720 are orthogonal to or at least intersected with each other, so that an included angle θ (e.g., 90° or approximated to 90°) is formed between the second sheet 710 and the second extending portion 720. Also, in the embodiment, a long axis direction (e.g., X axis) of the first sheet 610 and a long axis direction (e.g., X axis) of the second sheet 710 are parallel with each other. These first extending portions 620 extend from the first sheet 610 in the same direction (e.g., Y axis), and the second extending portions 720 extend from the second sheet 710 in the same direction (e.g., Y axis), but the extending direction of each of the first extending portions 620 and the extending direction of each of the second extending portions 720 are faced away from each other. However, the present disclosure is not limited thereto. Since the first extending portions 620 and the second extending portions 720 extend away from each other, the virtual axes (e.g., X axis) of the first opening 630 and the second opening 730 both pass through the aforementioned side plate 120 of the housing 100, which is convenient for interconnecting with external equipment, so that a problem that assembly interference is occurred when electricity transceiver devices 10 stacked along Z axis can be avoided.

It is noted, the second conductive terminal 700 is selectably (or switchably) electrically connected to the first conductive terminal. Therefore, when the second conductive terminal 700 is electrically connected to the first conductive terminal 600, the second conductive terminal 700 is disconnected from the second circuit module 160; on the contrary, when the second conductive terminal 700 is electrically insulated from the first conductive terminal 600, the another end of the second sheet 710 can be electrically connected to the second circuit module 160. In the embodiment, each of the second conductive terminals 700 is connected to the second circuit module 160 through the bracket H or the distance bolt B. However, the present disclosure is not limited thereto.

Thus, through the construction of the embodiments above, since the first sheet 610 of the first conductive terminal 600 and the second sheet 710 of the second conductive terminal 700 are collectively perpendicular to the front lateral face of the terminal base 300, and the first extending portions 620 and the second extending portions 720 extend away from each other, the virtual axes (e.g., X axis) of the first opening 630 and the second opening 730 both pass through the aforementioned side plate 120 of the housing 100, thus, it can avoid the trouble of wiring interference and facilitate the interconnection with the external equipment. Even if multiple housings 100 are stacked to be assembled in Z axis, the wiring space thereof will not be affected. An operator is allowed to be guided to complete the coupling task through the embedded screws in a locking direction perpendicular to the aforementioned side plate 120 of the housing 100, so as not to interfere with the locking direction, thereby optimizing the assembly time and convenience.

Figure 5:
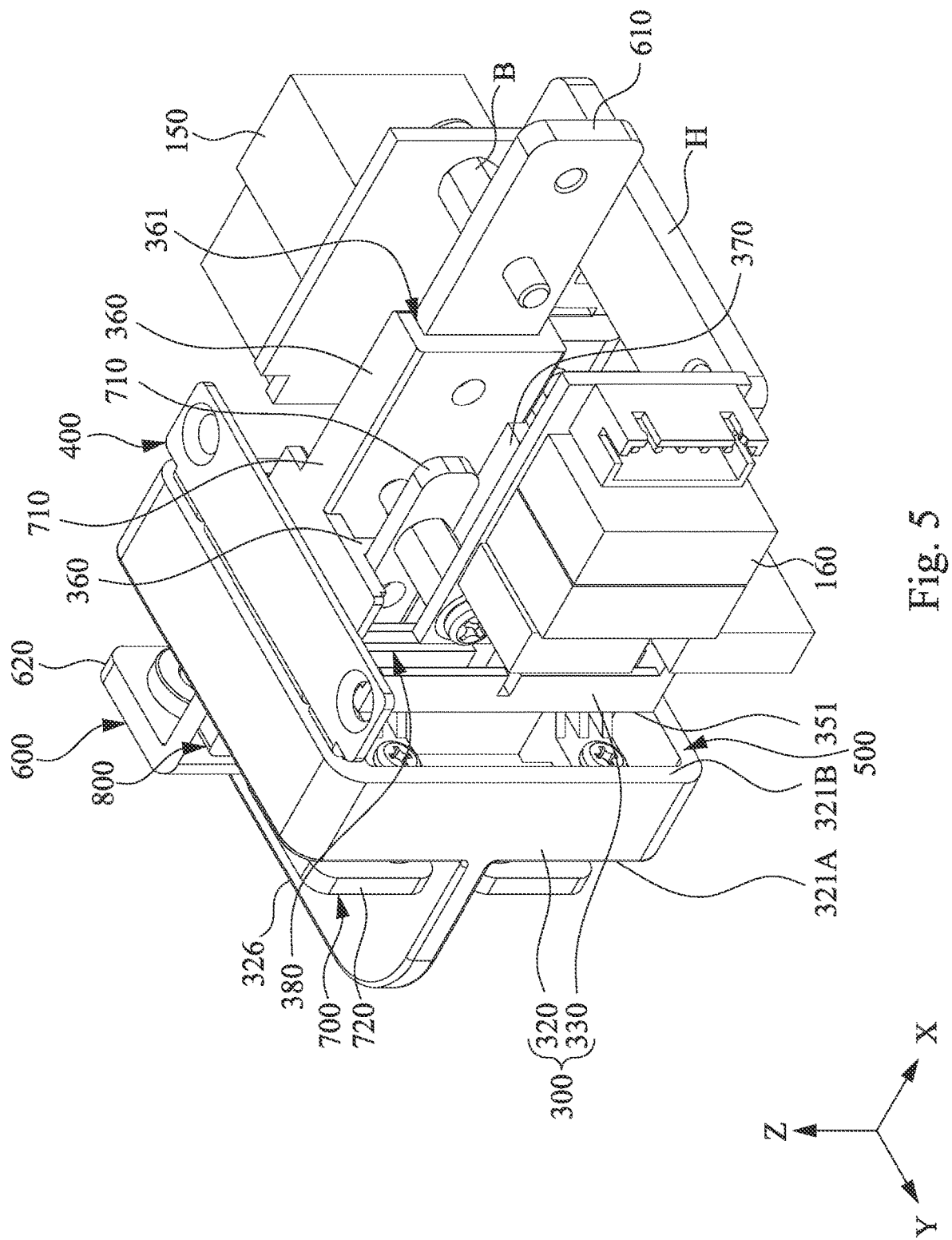
FIG. 5 is a perspective view of the electrical connector of FIG. 2 viewed from another perspective.
Figure 6:
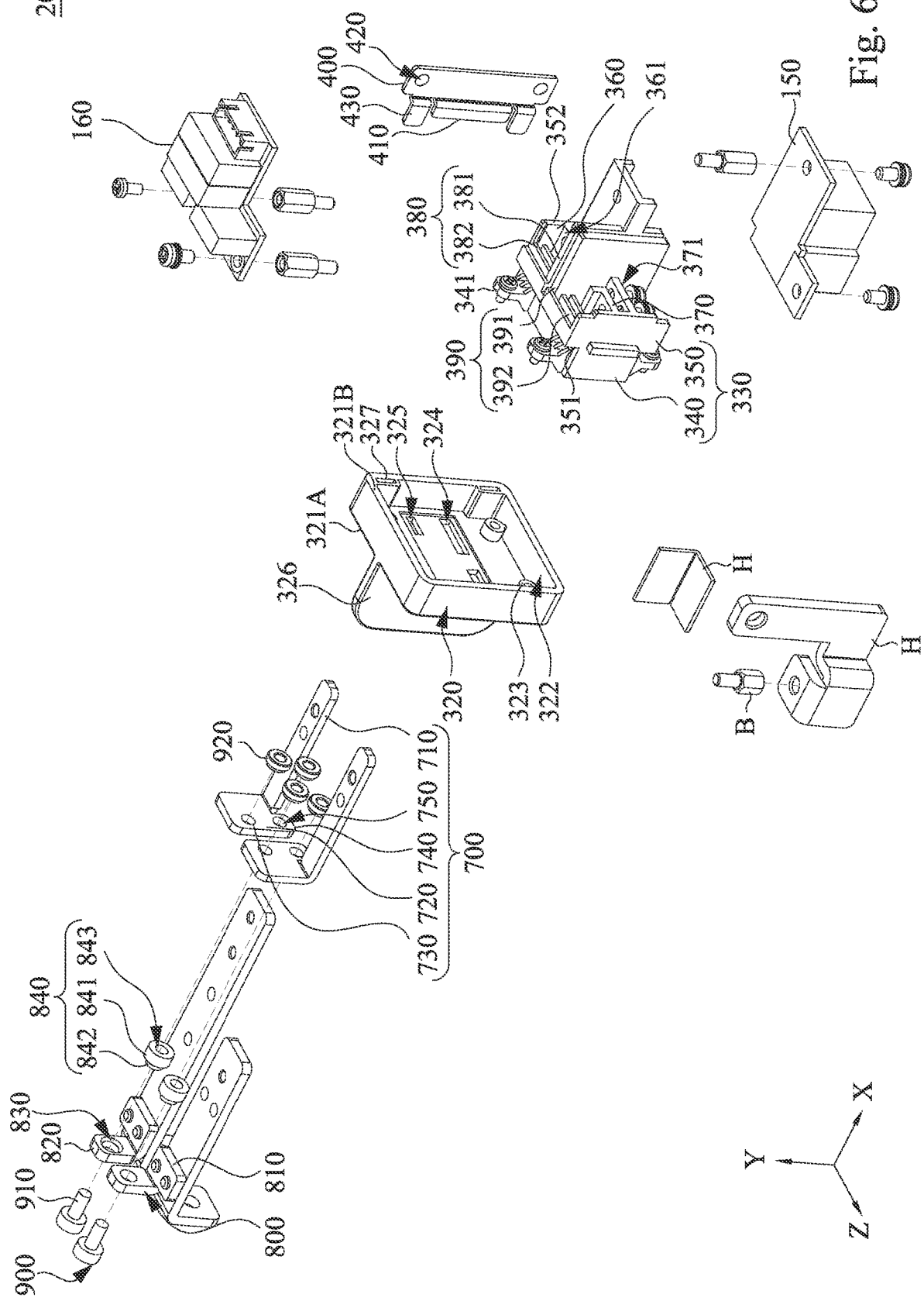
FIG. 6 is a disassembled view of the electrical connector of FIG. 5.

FIG. 5 is a perspective view of the electrical connector 200 of FIG. 2 viewed from another aspect. FIG. 6 is a disassembled view of the electrical connector 200 of FIG. 5. As shown in FIG. 3 and FIG. 6, the electrical connector 200 further includes two docking elements 800 located outside the housing 100. The docking elements 800 are respectively connected to the first conductive terminal 600 and the second conductive terminal 700, which are arranged on the same side. In the embodiment, the docking elements 800 are symmetrically disposed on the terminal base 300.

Each of the docking elements 800 includes a third sheet 810, a third extending portion 820 and a third opening 830 (e.g., screw hole). One end of the third sheet 810 is fixedly connected to one of the first sheet 610 which is on the same side with the third sheet 810. The third extending portion 820 extends transversely from another end of the third sheet 810. A long axis direction (e.g., X axis) of the third sheet 810 and a long axis direction (e.g., Y axis) of the third extending portion 820 are orthogonal to or at least intersected with each other, so that an included angle θ (e.g., 90° or approximated to 90°) is formed between the third sheet 810 and the third extending portion 820. The third opening 830 is located on the third extending portion 820, and a virtual axis (e.g., X axis) of the third opening 830 passes through the front lateral face of the terminal base 300. The second extending portion 720 is further formed with a fourth opening 750 (e.g., screw hole) that is coaxial and in communication with the third opening 830. More specifically, in the embodiment, the fourth opening 750 is formed on a lug 740 of the second extending portion 720. When the second extending portion 720 extends along a first direction (e.g., a positive direction of the Y axis), the lug 740 extends along a second direction opposite to the first direction (e.g., a negative direction of the Y axis).

The electrical connector 200 further includes two insulating ring 840 and two conductive posts 900. Each of the insulating rings 840 is directly stacked between the third opening 830 and the fourth opening 750 which are on the same side to electrically insulate the second conductive terminal 700 from the first conductive terminal 600. Each of the insulating rings 840 is formed with a through hole 843 that is coaxial and in communication with the third opening 830 and the fourth opening 750. Each of the conductive posts 900 is removably inserted in the third opening 830, the through hole 843 and the fourth opening 750 so as to be electrically conducted to the first conductive terminal 600 and the second conductive terminal 700. Therefore, when the conductive posts 900 is detached from the second conductive terminal 700 and the first conductive terminal 600 so that the second conductive terminal 700 is electrically insulated from the first conductive terminal 600, the second conductive terminal 700 can be electrically connected to the second circuit module 160.

In this embodiment, each of the insulating rings 840 includes a cylindrical body 841 and a flange 842. The flange 842 is connected to one end of the cylindrical body 841, and the through hole 843 collectively penetrates through the cylindrical body 841 and the flange 842. When the insulating rings 840 is directly stacked between the third opening 830 and the fourth opening 750, the cylindrical body 841 is directly stacked between the lug 740 and the third extending portion 820, and the flange 842 extends into the third opening 830. Accordingly, the insulating rings 840 can enhance the structural strength and avoid deformation.

It is noted, in the embodiment, the first conductive terminal 600, the second conductive terminal 700 and the docking elements 800 respectively include conductive metal (e.g., copper or aluminum), the first sheet 610 and the first extending portion 620 are integrally formed together, the second sheet 710 and the second extending portion 720 are integrally formed together, and the third sheet 810 and the third extending portion 820 are integrally formed together, however, the present disclosure is not limited thereto. In this embodiment, each of the conductive posts 900 is, for example, a bolt 910. Therefore, after the bolt 910 passes through the third opening 830, the through hole 843 and the fourth opening 750, a nut 920 can be sleeved on one end of the bolt 910, so that the bolt 910 can be effectively firmly limited therein, however, the present disclosure is not limited thereto.

The aforementioned terminal base 300 includes an external cover 310 and a supporting rack 330. The external cover 310 includes two first breaches 324 and two second breaches 325. The supporting rack 330 includes two first passages 331 and two second passages 332. After the supporting rack 330 and the external cover 310 are assembled with each other, each of the first passages 331 is aligned with one of the first breaches 324, and each of the second passages 332 is aligned with one of the second breaches 325 so that the first sheet 610 of each of the first conductive terminals 600 can be inserted into one of the first passages 331 from one of the first breaches 324, and the second sheet 710 of each of the second conductive terminals 700 can be inserted into one of the second passages 332 from one of the second breaches 325.

Thus, since the external cover 310 and the supporting rack 330 are two-piece independent components, the supporting rack 330 can extend a creepage distance from the conductive terminal to the housing 100 (i.e., ground area), thereby reducing leakage current and other potential hazards. However, the present disclosure is not limited thereto, in another embodiment, the terminal base 300 can also be made in one piece component.

More specifically, the external cover 310 includes a cover body 320 and one or more (e.g., four) first fixing portions 323. The cover body 320 includes a front surface 321A and a rear surface 321B which are opposite to each other. The rear surface 321B of the cover body 320 is faced towards the housing 100 (or supporting rack 330), and recessed with an accommodation recess 322. The first fixing portions 323 are respectively received within the accommodation recess 322. The supporting rack 330 includes a front portion 340 and a main body portion 350. The front portion 340 includes one or more (e.g., four) second fixing portions 341. The main body portion 350 includes a front surface 351 and a rear surface 352 which are opposite to each other. The rear surface 352 of the main body portion 350 is one surface of the main body portion 350 being opposite to the front portion 340. The front portion 340 is smaller than the main body portion 350, and the front portion 340 extends outwards from the front surface 351 of the main body portion 350 and extends into the accommodation recess 322.

Thus, the supporting rack 330 is fixedly connected to the external cover 310 through the second fixing portions 341 and the first fixing portion 323 being fixed to each other. In the embodiment, the front portion 340 and the main body portion 350 are formed integrally with each other, however, the present disclosure is not limited thereto. The external cover 310 further includes a partition plate 326. The partition plate 326 convexly protrudes from the front surface 321A of the cover body 320, and the partition plate 326 extends in the Y axis direction to separate the first conductive terminals 600 and the second conductive terminals 700 for reducing the probabilities of a short circuit occurred between the first conductive terminal 600 and a short circuit occurred between the second conductive terminals 700.

Also, the supporting rack 330 further includes two first shaft bushes 360 and two second shaft bushes 370. Each of the first shaft bushes 360 protrudes outwards from one surface of the supporting rack 330 facing away from the external cover 310, and is formed with a first internal groove 361 that is in communication with the first passage 331. Each of the second shaft bushes 370 protrudes outwards from the surface of the supporting rack 330 facing away from the external cover 310, and is formed with a second internal groove 371 that is in communication with the second passage 332. In this embodiment, the first shaft bushing 360 and the second shaft bushing 370 convexly protrude from the rear surface 352 of the main body portion 350 respectively; the lengths of the first shaft bushings 360 are different from each other, and the lengths of the second shaft bushings 370 are the same, however, the present disclosure is not limited thereto.

Thus, when the first sheet 610 of the first conductive terminal 600 extends into the first internal groove 361 from the first passage 331, the first internal groove 361 can guide the first sheet 610 to extend in an extending direction of the first internal groove 361. Similarly, when the second sheet 710 of the second conductive terminal 700 extends into the second internal groove 371 from the second passage 332, the second internal groove 371 can guide the second sheet 710 to extend in an extending direction of the second internal groove 371.

Since each of the first shaft bushings 360 assists to increase more surface areas of the supporting rack 330, it increases the space distance from the first conductive terminal 600 to the housing 100 (i.e., grounding area), thereby reducing potential hazards such as leakage; similarly, since the second shaft bushings 370 assists to increase more surface of the supporting rack 330, it elongates the space distance from the second conductive terminal 700 to the housing 100 (i.e., grounding area), thereby reducing potential hazards such as electric leakage.

In addition, the supporting rack 330 further includes a first concave structure 380 and a second concave structure 390. The first concave structure 380 is formed on one surface (i.e., the rear surface 352 of the main body portion 350) of the supporting rack 330 facing away from the external cover 310, and abutted to the first shaft bush 360. The second concave structure 390 is formed on the surface (i.e., the rear surface 352 of the main body portion 350) of the supporting rack 330 facing away from the external cover 310, and abutted to the second shaft bush 370.

Thus, since the first concave structure 380 is provided with more surface areas, the creepage distance from the first conductive terminal 600 to the housing 100 (i.e., grounding area) can be increased, so that a linear distance from the first conductive terminal 600 to the housing 100 is smaller than a creepage distance from the first conductive terminal 600 to the housing 100, thereby, reducing potential hazards such as electric leakage. Similarly, since the second concave structure 390 is provided with more surface areas, the creepage distance from the second conductive terminal 700 to the housing 100 (i.e., grounding area) can be increased, so that a linear distance from the second conductive terminal 700 to the housing 100 (i.e., grounding area) is smaller than a creepage distance from the second conductive terminal 700 to the housing 100, thereby, reducing potential hazards such as electric leakage.

In this embodiment, the first concave structure 380 includes a first separation plate 381 and a plurality of first recesses 382. The first separation plate 381 separates the first shaft bushes 360 from the second shaft bushes 370. Each of the first recesses 382 is separated by a plurality of partitions on the rear surface 352 of the main body portion 350. The second concave structure 390 includes a second separation plate 391 and a plurality of second recesses 392. The second separation plate 391 is aligned with the first separation plate 381, and separates the first shaft bushes 360 from the second shaft bushes 370. Each of the second recesses 392 is separated by a plurality of partitions on the rear surface 352 of the main body portion 350. However, the present disclosure is not limited thereto.

In the embodiment, the first concave structure 380 and the second concave structure 390 are respectively recessed on the rear surface 352 of the main body portion 350; the numbers of recesses which the first concave structure 380 and the second concave structure 390 have are not limited, however, the present disclosure is not limited thereto.

The terminal base 300 further includes a connecting plate 400. The connecting plate 400 includes a first rib 410, a plurality (e.g., two) of first locking portions 420 and a plurality (e.g., two) of second ribs 430. The first rib 410 and the second ribs 430 respectively protrude outwards from the same side of the connecting plate 400, and the first rib 410 is located between the second ribs 430. The cover body 320 is further formed with one or more insertion holes 327 at the rear surface 321B thereof.

Accordingly, when the connecting plate 400 is assembled to the cover body 320, the first rib 410 extends into and abuts against the accommodation recess 322, and each of the second ribs 430 is respectively inserted into one of the insertion holes 327, so that the connecting plate 400 can be fixed on the rear surface 321B of the cover body 320. The housing 100 is provided with a frame 130 (FIG. 1) at the aforementioned side plate 120. The frame 130 includes one or more notches 131. The frame 130 is provided with one or more second locking portions 133 corresponding to each of the notches 131. Two opposite guiding slits 500 on two opposite sides of the supporting rack 330 are respectively defined between the front surface 351 of the main body portion 350 and the rear surface 321B of the cover body 320. Two opposite side edges of the frame 130 facing towards the notch 131 are respectively formed with two side portions 132. Thus, when the electrical connector 200 enters the notch 131 of the frame 130 downwardly, the side portions 132 are respectively slid and inserted into the guiding slits 500, and the second locking portion 133 is then locked to the first locking portion 420, thus, the electrical connector 200 is fixedly installed on the housing 100.

In the above embodiments, the electricity transceiver device 10 can be a miniaturized power product, such as a direct current (DC) power supply or an alternating current (AC) power supply, an analog load, a unidirectional or bidirectional (e.g., single/bi-direction) power converter, power supply (e.g., source) or battery and so on. The first circuit module 150 includes, for example, a single board with functions of telemetry and filtering. The second circuit module 160 includes, for example, a detector with a telemetry voltage value. The housing 100 includes a server chassis whose height is, for example, 1 U, however, the present disclosure is not limited thereto.

Due to the shortcomings and deficiencies of the conventional design in the wiring and the overall system, including assembly interference, difficult assembly, flashover, bulky, jumper cross-over or weak locking, through the above-mentioned structure, the present invention can solve the above-mentioned shortcomings and deficiencies, to propose an implementation plan to solve multiple problems at one time without consuming too much volume.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An electricity transceiver device, comprising:
   a housing surrounding an accommodating space;
   a first circuit module received within the accommodating space; and
   an electrical connector comprising:
      a terminal base fixed on one side surface of the housing;
      at least one first conductive terminal penetrating through the terminal base, comprising a first sheet, a first extending portion and a first opening, one end of the first sheet extending through a front lateral face of the terminal base, and another end of the first sheet electrically connected to the first circuit module, the first extending portion extending transversely from the one end of the first sheet, and formed with an included angle with the first sheet, the first opening located on the first extending portion, and a virtual axis of the first opening passing through the front lateral face of the terminal base; and
      at least one second conductive terminal penetrating through the terminal base, comprising a second sheet, a second extending portion and a second opening, one end of the second sheet extending through the front lateral face of the terminal base, and arranged abreast with the first sheet, the second extending portion extending transversely from the one end of the second sheet, and formed with an included angle with the second sheet, the second opening located on the second extending portion, and a virtual axis of the second opening passing through the front lateral face of the terminal base,
      wherein the at least one second conductive terminal is switchably electrically connected to the at least one first conductive terminal.

2. The electricity transceiver device of claim 1, wherein the electrical connector further comprises at least one docking element, the at least one docking element comprises a third sheet, a third extending portion and a third opening, one end of the third sheet is fixedly connected to the first sheet, the third extending portion extending transversely from another end of the third sheet, and formed with an included angle with the third sheet, the third opening located on the third extending portion, and a virtual axis of the third opening passing through the front lateral face of the terminal base; and
   the second extending portion is further formed with a fourth opening that is coaxial and in communication with the third opening.

3. The electricity transceiver device of claim 2, wherein the electrical connector further comprises at least one insulating ring, the at least one insulating ring is directly stacked between the third opening and the fourth opening to electrically insulate the at least one second conductive terminal from the at least one first conductive terminal.

4. The electricity transceiver device of claim 3, further comprising:
   a second circuit module located within the housing and electrically connected to the another end of the second sheet.

5. The electricity transceiver device of claim 3, wherein the at least one insulating ring is formed with a through hole that is coaxial and in communication with the third opening and the fourth opening; and
   the electrical connector further comprises at least one conductive post removably inserted into the third opening, the through hole and the fourth opening, and electrically conducted to the at least one first conductive terminal and the at least one second conductive terminal.

6. The electricity transceiver device of claim 1, wherein the terminal base comprises:
   an external cover comprising at least one first breach and at least one second breach; and
   a supporting rack connected to the external cover and the housing, comprising at least one first passage and at least one second passage, the at least one first passage penetrating through the supporting rack and aligned with the at least one first breach for accommodating the first sheet, the at least one second passage penetrating through the supporting rack and aligned with the at least one second breach for accommodating the second sheet.

7. The electricity transceiver device of claim 6, wherein the supporting rack further comprises:
   at least one first shaft bush protruding outwards from one surface of the supporting rack facing away from the external cover, and formed with a first internal groove that is in communication with the at least one first passage, and the first internal groove is used to guide the first sheet to extend in an extending direction of the first internal groove; and
   at least one second shaft bush protruding outwards from the one surface of the supporting rack facing away from the external cover, and formed with a second internal groove that is in communication with the at least one second passage, and the second internal groove is used to guide the second sheet to extend in an extending direction of the second internal groove.

8. The electricity transceiver device of claim 7, wherein the supporting rack further comprises:
   a first concave structure formed on the one surface of the supporting rack facing away from the external cover, and abutted to the at least one first shaft bush so that a linear distance from the at least one first conductive terminal to the housing is smaller than a creepage distance from the at least one first conductive terminal to the housing; and
   a second concave structure formed on the one surface of the supporting rack facing away from the external cover, and abutted to the at least one second shaft bush so that a linear distance from the at least one second conductive terminal to the housing is smaller than a creepage distance from the at least one second conductive terminal to the housing.

9. The electricity transceiver device of claim 6, wherein the external cover further comprises a cover body and a first locking portion, one surface of the cover body facing towards the housing is formed with an accommodation recess, and the first locking portion is arranged on the one surface of the cover body;
   the supporting rack comprises a front portion and a main body portion, the front portion extends into the accommodation recess from one surface of the main body portion, and two opposite guiding slits are respectively defined between the one surface of the main body portion and the one surface of the cover body; and
   the one side surface of the housing is provided with a notch and a second locking portion, and two opposite lateral edges of the housing facing towards the notch are respectively inserted into the guide slits, and the second locking portion is locked to the first locking portion.

10. The electricity transceiver device of claim 6, wherein when the at least one first conductive terminal and the at least one second conductive terminal are two in number, respectively, and the external cover further comprises a partition plate located on one surface of the external cover facing away from the supporting rack for separating the first conductive terminals and separating the second conductive terminals.

11. An electrical connector of an electricity transceiver device, comprising:
   a terminal base;
   at least one first conductive terminal penetrating through the terminal base, comprising a first sheet, a first extending portion and a first opening, one end of the first sheet extending through a front lateral face of the terminal base, and the first extending portion extending transversely from the one end of the first sheet, and formed with an included angle with the first sheet, the first opening located on the first extending portion, and a virtual axis of the first opening passing through the front lateral face of the terminal base; and
   at least one second conductive terminal penetrating through the terminal base, comprising a second sheet, a second extending portion and a second opening, one end of the second sheet extending through the front lateral face of the terminal base, and arranged abreast with the first sheet, the second extending portion extending transversely from the one end of the second sheet, and formed with an included angle with the second sheet, the second opening located on the second extending portion, and a virtual axis of the second opening passing through the front lateral face of the terminal base,
   wherein the at least one second conductive terminal is switchably electrically connected to the at least one first conductive terminal.

12. The electrical connector of the electricity transceiver device of claim 11, further comprising:
   at least one docking element comprising a third sheet, a third extending portion and a third opening, one end of the third sheet fixedly connected to the first sheet, the third extending portion extending transversely from another end of the third sheet, and formed with an included angle with the third sheet, the third opening located on the third extending portion, and a virtual axis of the third opening passing through the front lateral face of the terminal base; and
   the second extending portion is further formed with a fourth opening that is coaxial and in communication with the third opening.

13. The electrical connector of the electricity transceiver device of claim 12, further comprising:
   at least one insulating ring directly stacked between the third opening and the fourth opening to electrically insulate the at least one second conductive terminal from the at least one first conductive terminal.

14. The electrical connector of the electricity transceiver device of claim 13, wherein the at least one insulating ring is formed with a through hole that is coaxial and in communication with the third opening and the fourth opening, wherein the third opening, the through hole and the fourth opening are inserted through by a conductive post so as to electrically conduct to the at least one first conductive terminal and the at least one second conductive terminal.

15. The electrical connector of the electricity transceiver device of claim 11, wherein the terminal base comprises:
   an external cover comprising at least one first breach and at least one second breach; and
   a supporting rack connected to the external cover, comprising at least one first passage and at least one second passage, the at least one first passage penetrating through the supporting rack and aligned with the at least one first breach for accommodating the first sheet, the at least one second passage penetrating through the supporting rack and aligned with the at least one second breach for accommodating the second sheet.

16. The electrical connector of the electricity transceiver device of claim 15, wherein the supporting rack further comprises:
   at least one first shaft bush protruding outwards from one surface of the supporting rack facing away from the external cover, and formed with a first internal groove that is in communication with the at least one first passage, and the first internal groove is used to guide the first sheet to extend in an extending direction of the first internal groove; and
   at least one second shaft bush protruding outwards from the one surface of the supporting rack facing away from the external cover, and formed with a second internal groove that is in communication with the at least one second passage, and the second internal groove is used to guide the second sheet to extend in an extending direction of the second internal groove.

17. The electrical connector of the electricity transceiver device of claim 16, wherein the supporting rack further comprises:

a first concave structure formed on the one surface of the supporting rack facing away from the external cover, and abutted to the at least one first shaft bush; and a second concave structure formed on the one surface of the supporting rack facing away from the external cover, and abutted to the at least one second shaft bush.

18. The electrical connector of the electricity transceiver device of claim 15, wherein the external cover further comprises a cover body and a locking portion, one surface of the cover body is formed with an accommodation recess, and the locking portion is arranged on the one surface of the cover body; and the supporting rack comprises a front portion and a main body portion, the front portion extends into the accommodation recess from one surface of the main body portion, and two opposite guiding slits are respectively defined between the one surface of the main body portion and the one surface of the cover body, and the opposite guiding slits are used to fix on a housing.

19. The electrical connector of the electricity transceiver device of claim 15, wherein when the at least one first conductive terminal and the at least one second conductive terminal are two in number, respectively, and the external cover further comprises a partition plate located on one surface of the external cover facing away from the supporting rack for separating the first conductive terminals and separating the second conductive terminals.

* * * * *